US010418791B2

(12) United States Patent
Jensen

(10) Patent No.: US 10,418,791 B2
(45) Date of Patent: Sep. 17, 2019

(54) MOUNT FOR ACCESS POINT

(71) Applicant: Bjorn Jensen, Miami, FL (US)

(72) Inventor: Bjorn Jensen, Miami, FL (US)

( * ) Notice: Subject to any disclaimer, the term of this patent is extended or adjusted under 35 U.S.C. 154(b) by 0 days.

(21) Appl. No.: 15/705,066

(22) Filed: Sep. 14, 2017

(65) Prior Publication Data
US 2018/0076600 A1  Mar. 15, 2018

Related U.S. Application Data

(60) Provisional application No. 62/394,498, filed on Sep. 14, 2016.

(51) Int. Cl.
| H01J 5/00 | (2006.01) |
| H02B 1/40 | (2006.01) |
| H05K 5/02 | (2006.01) |
| H01R 13/502 | (2006.01) |
| H01R 13/46 | (2006.01) |
| H05K 5/00 | (2006.01) |
| H01L 23/10 | (2006.01) |
| H02G 3/08 | (2006.01) |
| H02G 3/10 | (2006.01) |
| H02G 3/12 | (2006.01) |
| H02G 3/20 | (2006.01) |

(52) U.S. Cl.
CPC .............. *H02B 1/40* (2013.01); *H05K 5/0204* (2013.01); *H01L 23/10* (2013.01); *H02G 3/08* (2013.01); *H02G 3/086* (2013.01); *H02G 3/10* (2013.01); *H02G 3/12* (2013.01); *H02G 3/20* (2013.01); *H05K 5/00* (2013.01); *H05K 5/0004* (2013.01); *H05K 5/0052* (2013.01); *H05K 5/02* (2013.01)

(58) Field of Classification Search
CPC ........ H01L 23/10; H05K 5/00; H05K 5/0004; H05K 5/02; H05K 5/0052; H02G 3/08; H02G 3/086; H02G 3/10; H02G 3/12; H02G 3/20
USPC ..... 174/50, 50.5, 50.51, 520, 535, 559, 560, 174/562, 58
See application file for complete search history.

(56) References Cited

U.S. PATENT DOCUMENTS

| 6,345,800 B1 | 2/2002 | Herst et al. |
| 7,763,797 B2 | 7/2010 | Pak |
| 8,928,533 B2 | 1/2015 | Spivey |
| 2006/0211451 A1* | 9/2006 | Pak ........................ H02G 3/123 455/561 |
| 2008/0247160 A1 | 10/2008 | Jiang |

(Continued)

*Primary Examiner* — Binh B Tran
(74) *Attorney, Agent, or Firm* — Johnson & Martin, P.A.; James David Johnson

(57) ABSTRACT

A mount for attaching an access point (AP) device to a surface is described. The mount includes a housing, a tension member for securing the AP within a compartment of the housing, a retention device for securing the tension member to or about the housing with adjustable tension, and attachment means for securing the mount to or in the ceiling or wall. The tension member can be a cable and the retention device can be a cable retention device. The cable can include first and second ends attached to first and second ends of a spring that maintains tension on the cable even if the cable begins to relax over time while securing the AP within the compartment. The mount can also include a cover for concealing the AP within the housing. The cover, the housing, or both can include magnets for securing the cover to the housing.

18 Claims, 22 Drawing Sheets

(56) References Cited

U.S. PATENT DOCUMENTS

2010/0178795 A1\* 7/2010 Spivey .................. H02G 3/123
439/527
2013/0319752 A1 12/2013 Cowles et al.

\* cited by examiner

MOUNT FOR ACCESS POINT

CROSS-REFERENCE TO RELATED APPLICATIONS

This application is a nonprovisional application of and claims priority from U.S. provisional patent application Ser. No. 62/394,498 filed on Sep. 14, 2016. The foregoing applications are incorporated in their entirety herein by reference.

FIELD OF THE INVENTION

The invention relates to a mount for attaching a device to a surface. More particularly, the invention relates to a mount for attaching a wireless access point device to a ceiling or wall.

BACKGROUND

An access point ("AP") is a networking hardware device for transmitting and receiving wireless signals to and from one or more wireless devices and a wired network, e.g., the Internet or a local area network. APs are often included as components of routers and provide wireless signals such as Wi-Fi used to connect wireless devices to a wired network. These hardware devices ideally are located in a position within a room or area space in such a way that signals transmitted to and from the AP are not blocked, interrupted, or otherwise attenuated. Walls, heavy furniture, and other objects may weaken, disrupt, or block such signals. Therefore, positioning of the AP in a central location within a room or other area is desirable; however, such locations leave the AP visible, which may be undesirable for aesthetic purposes. Alternatively, the AP may be concealed inside a closet, for example, a media closet, or within a cabinet; however, for the aforementioned reasons related to signal attenuation caused by transmission through walls or furniture, such positioning may also be undesirable.

The AP may also be attached to a wall or ceiling of a room or other area to provide uninterrupted coverage of the room or other area for purposes of transmitting and receiving signals between wireless devices and the wired network. Again, however, such positioning may be undesirable for aesthetic reasons because the AP will remain visible when installed on a wall or ceiling.

What is needed is a mount for installing an AP in a concealed manner in a ceiling or wall while maximizing signal strength within a room or other area by avoiding installation behind walls and objects that can block or impede signal access in certain areas or throughout an entire room or other area. What is also needed is a mount that enables quick and easy access to and removal of the AP in the event that a new AP must be installed. A further need exists for a universal mount, which may be used to secure and conceal in or to a ceiling or wall, APs in the many shapes and sizes created by manufacturers.

SUMMARY

The invention relates to a mount for attaching an access point device ("AP"), also referred to herein as a wireless access point device or AP device, to or in a ceiling or wall. The mount includes a housing, a tension member (e.g., a cable, band, or strap) for securing the AP within a compartment of the housing, a retention device for securing the tension member to or about the housing with sufficient but adjustable tension, and attachment means for securing the mount to or in the ceiling or wall. In exemplary embodiments, the tension member can be a cable and the retention device can be a cable retention device. The cable can include first and second ends attached to first and second ends of a spring that maintains an appropriate tension on the cable even if the cable begins to relax over time while securing the AP within the compartment. The housing can include a utility aperture to permit an Ethernet cable, USB cable, telephone line, coaxial cable, power cord, or other data or power connection to be inserted therethrough to be attached to the AP so as to supply power and a communicative connection to a wired network. The mount can also include a cover for concealing the AP within the housing. The cover can be a solid plate or a screen or mesh that is similar in appearance to the screens and meshes used with in-ceiling-mounted and in-wall-mounted audio speakers so as to be aesthetically acceptable within a room of a home or other room or area. Both the cover and housing can be painted to match the décor of the room or area. The mount may also include one or more spacers or other means can be used to offset the AP closer to the room interior or space, thereby minimizing signal attenuation caused by surrounding walls or objects.

The mount described herein provides an advantage by allowing installation of an AP in a concealed manner in a ceiling or wall while maximizing signal strength within a room or other area by avoiding installation behind walls and objects that can block or impede signal access in certain areas or throughout an entire room or other area.

The mount described herein also provides an advantage by enabling quick and easy access to and removal of the AP in the event that maintenance is required or a new AP must be installed.

The mount described herein provides a further advantage by allowing for the AP to be mounted generally flush to and in a ceiling or wall so that both the mount and AP installed within it are concealed behind a cover that is constructed to have an appearance that is aesthetically acceptable and that can be similar or identical to an in-ceiling-mounted or in-wall-mounted audio speaker, which users are accustomed to seeing and which are not generally considered aesthetically objectionable or displeasing when visible.

The mount described herein provides yet another advantage in that its usage allows in-ceiling installation of the AP to maximize signal coverage and strength throughout a room or area while avoiding installation at lower locations around the peripheral walls of a room or other area or within a closet, media closet, or media cabinet that might attenuate the signals being transmitted to and from the AP. Equivalent signal coverage of the room or other area can potentially be provided with fewer APs.

Accordingly, the invention features a mount for attaching a wireless access point (AP) device to a surface. The mount includes a housing having a bottom wall and at least one side wall defining a compartment, a tension member for securing the AP device within the compartment of the housing; a retention device for securing the tension member to or about the housing with adjustable tension, and attachment means for securing the mount to the ceiling.

In another aspect, the invention can feature the tension member including one or more cables, bands, straps, other suitable tension members, or combinations of two or more of the foregoing.

In another aspect, the invention can feature the tension member being a cable and the retention device being a cable retention device.

In another aspect, the invention can feature the bottom wall of the housing including at least one aperture through which the cable is insertable to retain the AP device in position within the compartment of the housing.

In another aspect, the invention can feature the mount further including a securement apparatus for securing the tension member to the housing.

In another aspect, the invention can feature the securement apparatus including a spring to maintain tension on the tension member and the tension member being a cable. The spring includes a first end and a second end and is located adjacent to the top surface of the housing. A first end of the cable is attached to a first end of the spring and a second end of the cable is attached to the second end of the spring.

In another aspect, the invention can feature the cable retention device including a cable winding device that has a knob for winding and unwinding the cable to create more or less tension for adjustably positioning the AP device between the cable and the bottom wall of the housing and for releasing and removing the AP device from the compartment of the housing by lessening the tension of the cable.

In another aspect, the invention can feature the bottom wall of the housing including a first aperture, a second aperture, a third aperture, and a fourth aperture. The second end of the cable is inserted through a top surface of the housing through the first aperture and into the compartment so that the second end of the cable runs generally horizontally across the bottom wall in a first direction to the second aperture located on a second side of the compartment that is opposite to a first side of the compartment on which the first aperture is located. The second end of the cable passes through the second aperture and out of the compartment to emerge from the second aperture at the top surface of the housing. The second end of the cable is engaged by the cable retention device at the top surface of the housing so that the cable may be tightened or loosened as desired for installation, positional adjustment, and removal of the AP device within the compartment. The second end of the cable passes through the third aperture at the top surface back into the compartment so that the cable runs generally horizontally across the bottom wall in a second direction to the fourth aperture located on a fourth side of the compartment that is opposite to a third side of the compartment on which the third aperture is located. The second end of the cable is insertable through the fourth aperture where it exits the compartment and emerges at the top surface of the housing to connect to the second end of the spring.

In another aspect, the invention can feature the mount further including a cover for attaching over an opening of the housing and for concealing the AP device within the housing.

In another aspect, the invention can feature the housing including one or more magnets on or near a lip of the housing for holding in place the cover when the cover is constructed from a ferromagnetic material.

In another aspect, the invention can feature the cover being constructed from a material other than a ferromagnetic material. The cover can include one or more ferromagnetic pieces on or near an interior surface of the cover for holding the cover in place.

In another aspect, the invention can feature the housing being constructed from a ferromagnetic metal and further including one or more magnets on or near an interior surface of the cover for holding the cover in place.

In another aspect, the invention can feature the housing being constructed from a material other than a ferromagnetic metal. The housing can include one or more magnets on or near an interior surface of the cover and one or more ferromagnetic pieces for holding the cover in place.

In another aspect, the invention can feature the mount further including a spacer placed between a bottom surface of the AP device and the bottom wall inside the compartment to raise the AP device within the compartment.

In another aspect, the invention can feature the attachment means including one or more clamps, swing clamps, clips, hooks, screws, nails, nuts and bolts, other suitable attachment means, or combinations of two or more of the foregoing.

In another aspect, the invention can feature the surface being a ceiling or a wall.

In another aspect, the invention can feature the housing including a lip that is flush or substantially flush against the surface when the mount is installed.

A method of the invention can be used for securing a wireless access point (AP) device to a surface. The method includes the steps of: (a) cutting an aperture into a surface on which an AP device is to be installed; and (b) installing a mount over the aperture on the surface using attachment means for securing the mount to the surface. The mount includes a housing having a bottom wall and at least one side wall defining a compartment, wherein the compartment remains accessible once the mount is installed. The mount also includes a tension member for securing the AP device within the compartment of the housing, a retention device for securing the tension member to or about the housing with adjustable tension, and the attachment means for securing the mount to the surface. The attachment means connect the housing to one or more edges of the surface defining the aperture. The method also includes the step of: (c) securing the AP device within the compartment using the tension member and the retention device.

Another method of the invention can include the step of: (d) placing a cover over the compartment of the housing to conceal the compartment and the AP device secured within the compartment.

Another method of the invention can feature the surface being a ceiling or a wall.

Unless otherwise defined, all technical terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents and other references mentioned herein are incorporated by reference in their entirety. In the case of conflict, the present specification, including definitions will control.

DETAILED DESCRIPTION

Figure 1:
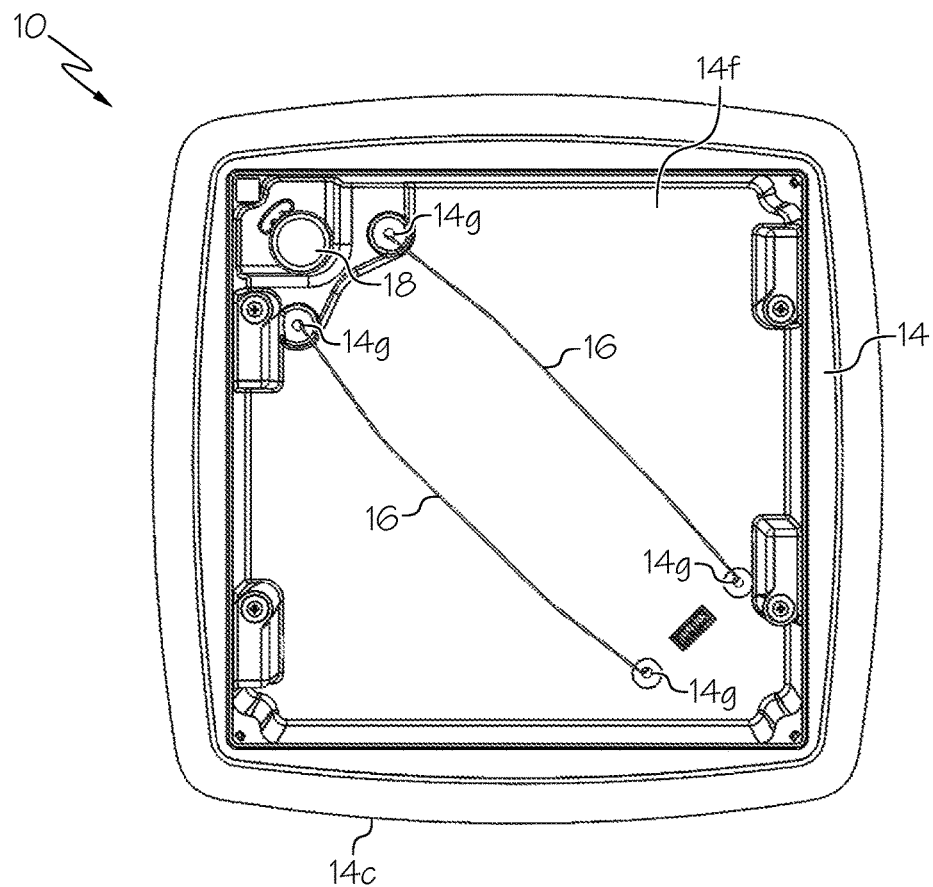
FIG. 1 is a bottom plan view of one embodiment of a mount for installing an access point device ("AP") to a ceiling or a wall.
Figure 2:
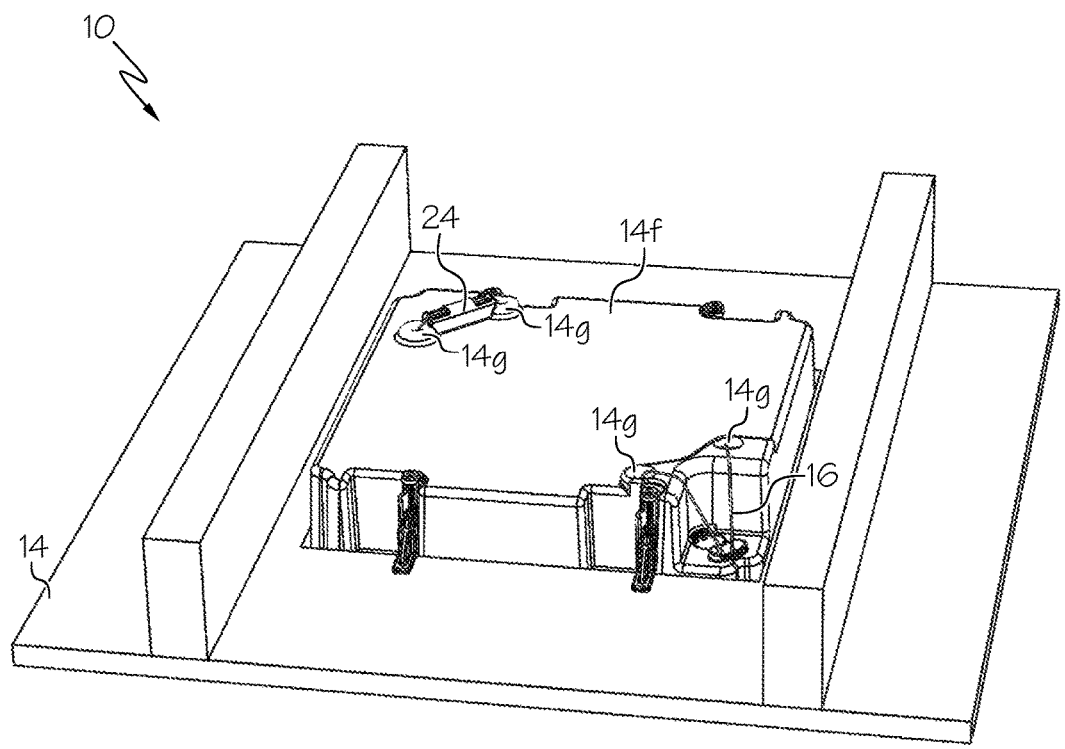
FIG. 2 is a front perspective view of a top of the mount of FIG. 1, installed in a ceiling between joists.
Figure 3:
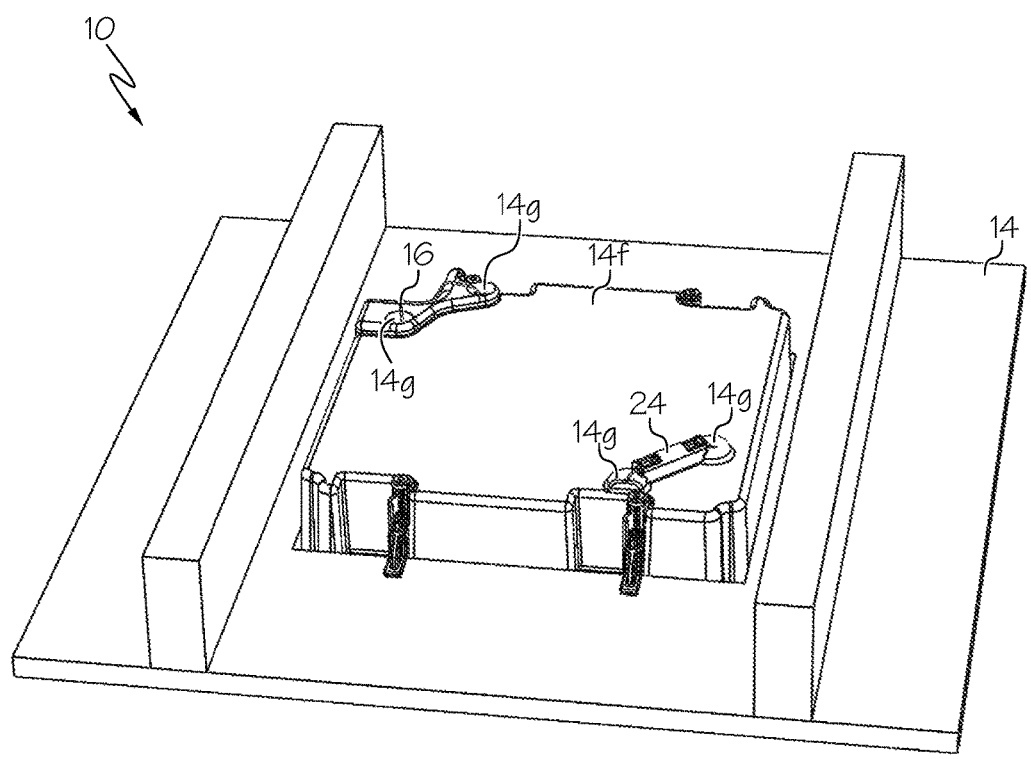
FIG. 3 is a rear perspective view of the mount of FIG. 2, installed in a ceiling between joists.
Figure 4:
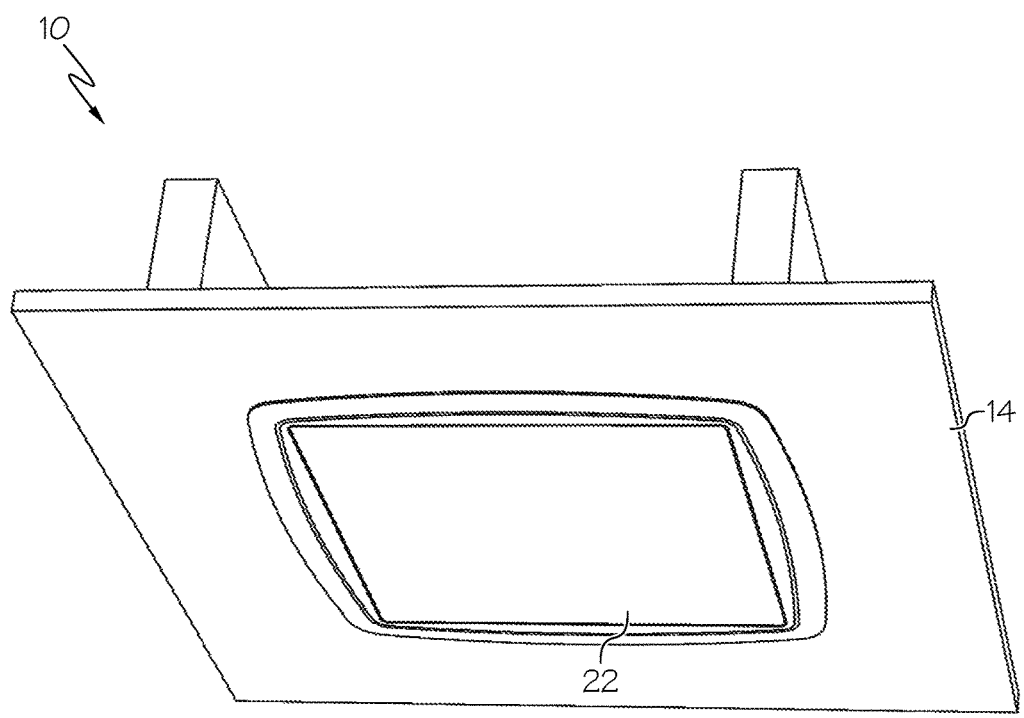
FIG. 4 is a front perspective view of a bottom of the mount of FIG. 1, installed in a ceiling between joists.
Figure 5:
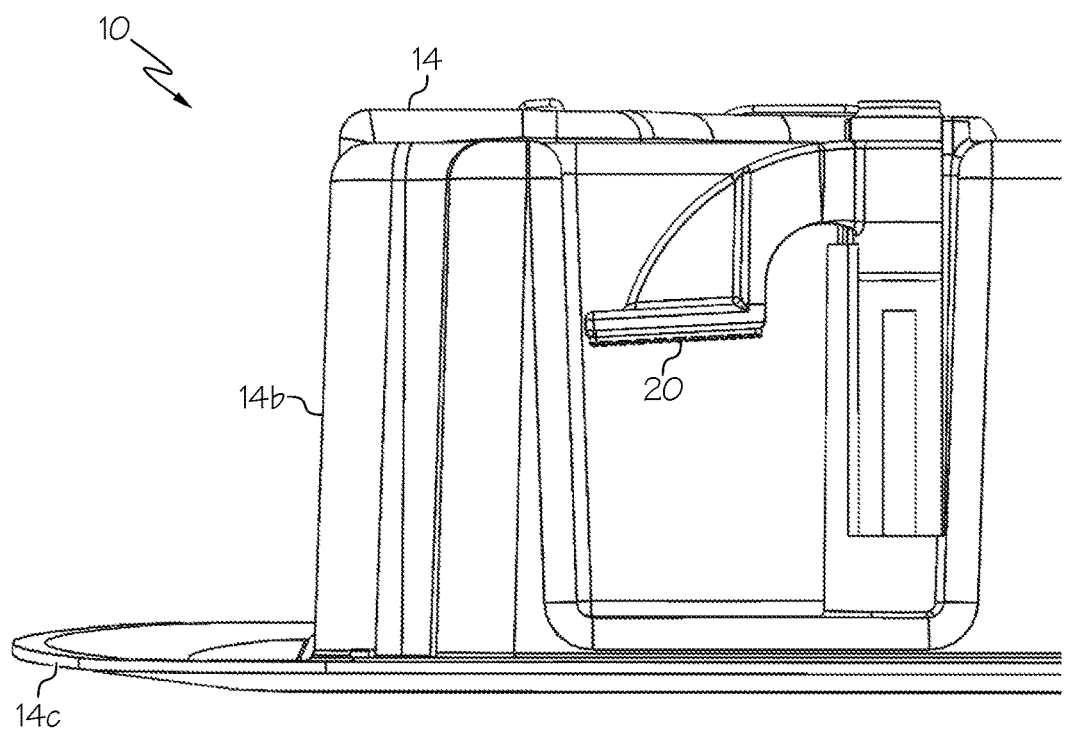
FIG. 5 is a close-up side view of a swing clamp in a tightened configuration but without a screw, used as a component of the mount of FIG. 1, wherein the mount is shown uninstalled.
Figure 6:
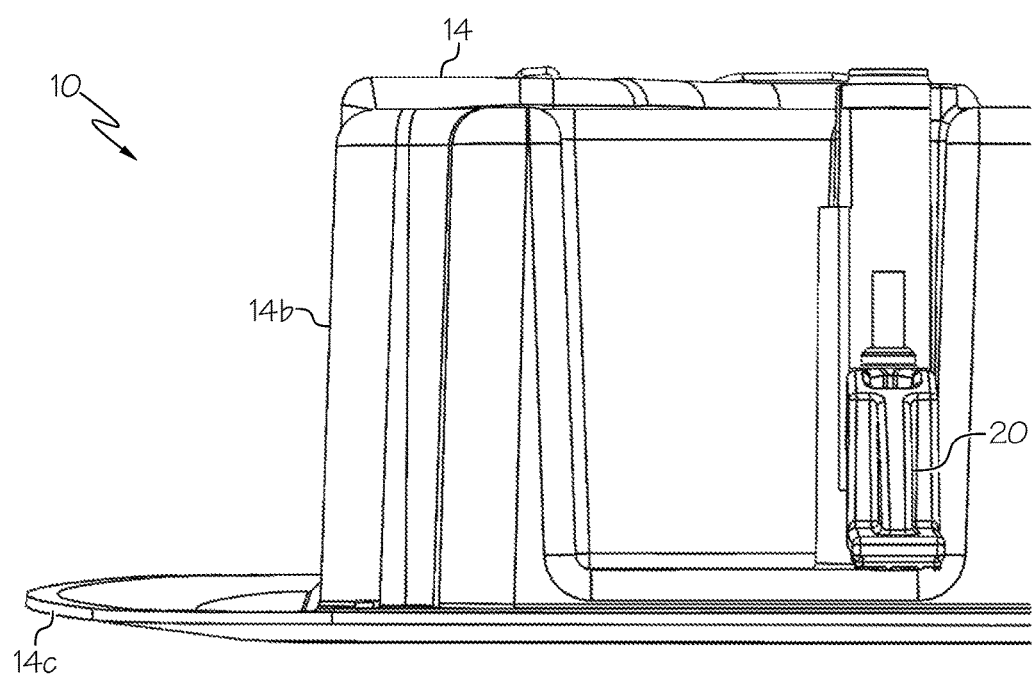
FIG. 6 is a close-up side view of a swing clamp in a loosened configuration but without a screw, used as a component of the mount of FIG. 1, wherein the mount is shown uninstalled.
Figure 7:
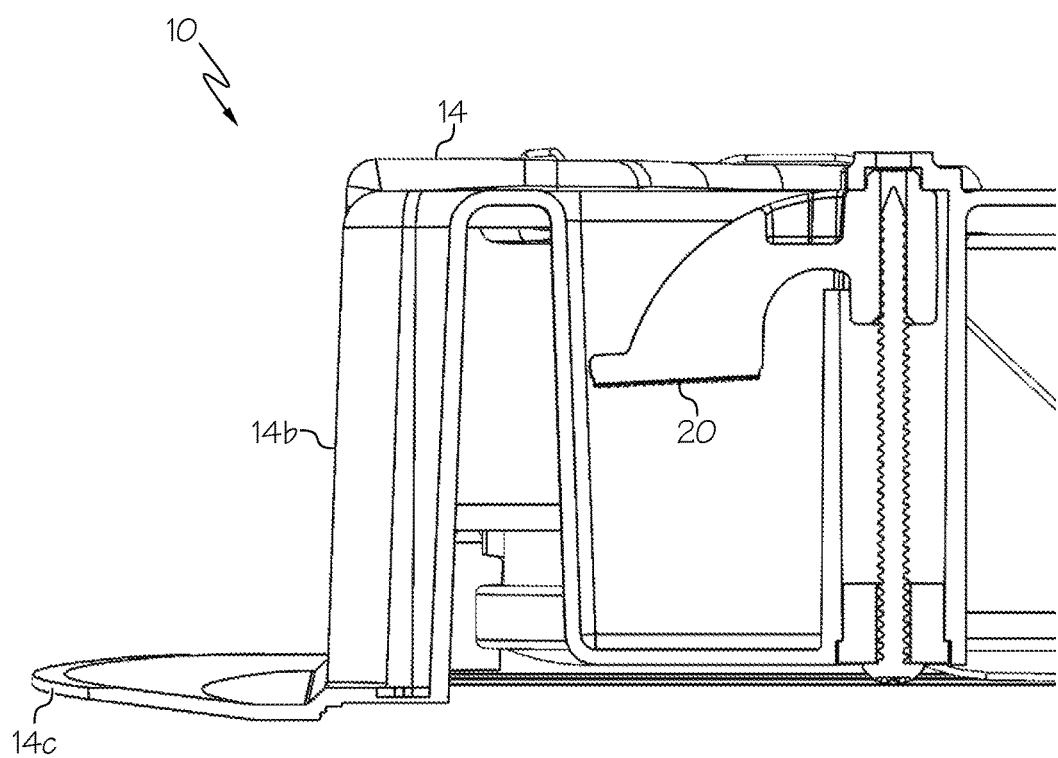
FIG. 7 is a close-up sectional view of a swing clamp in a tightened configuration with a screw, used as a component of the mount of FIG. 1, wherein the mount is shown uninstalled.
Figure 8:
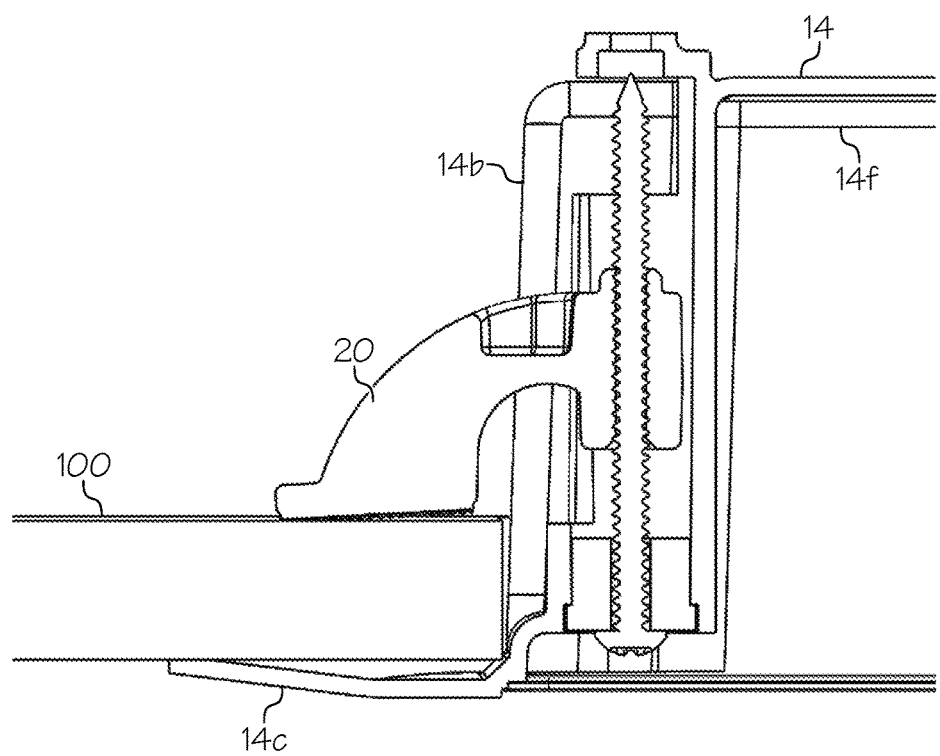
FIG. 8 is a close-up sectional view of a swing clamp in a tightened configuration with a screw, used as a component of the mount of FIG. 1, wherein the mount is shown installed.
Figure 9:
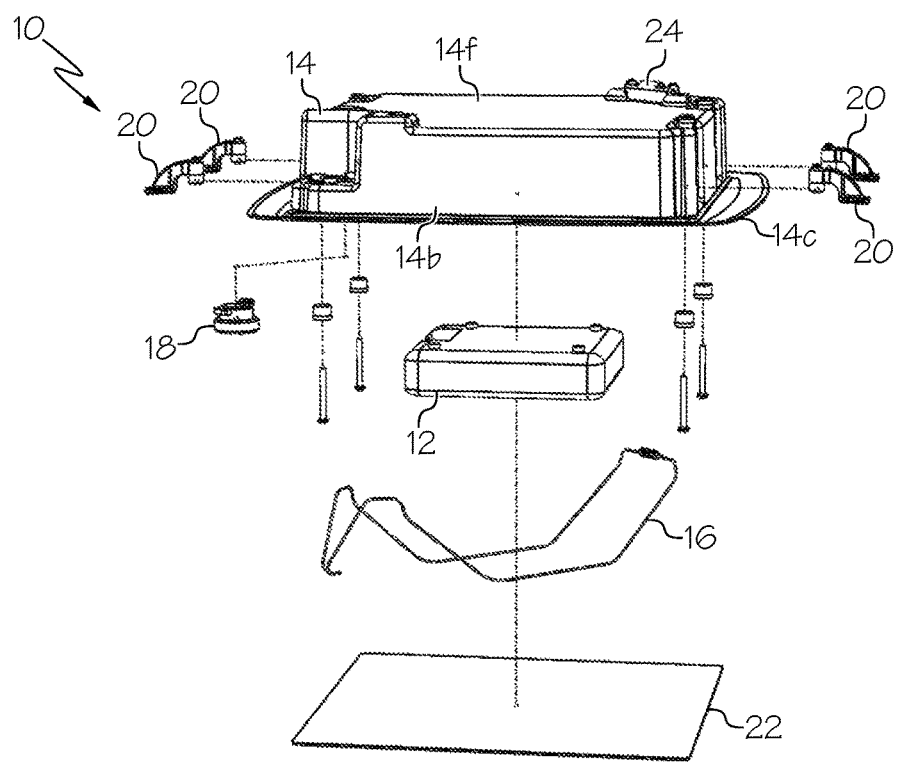
FIG. 9 is an exploded front perspective view of the mount of FIG. 1.
Figure 10:
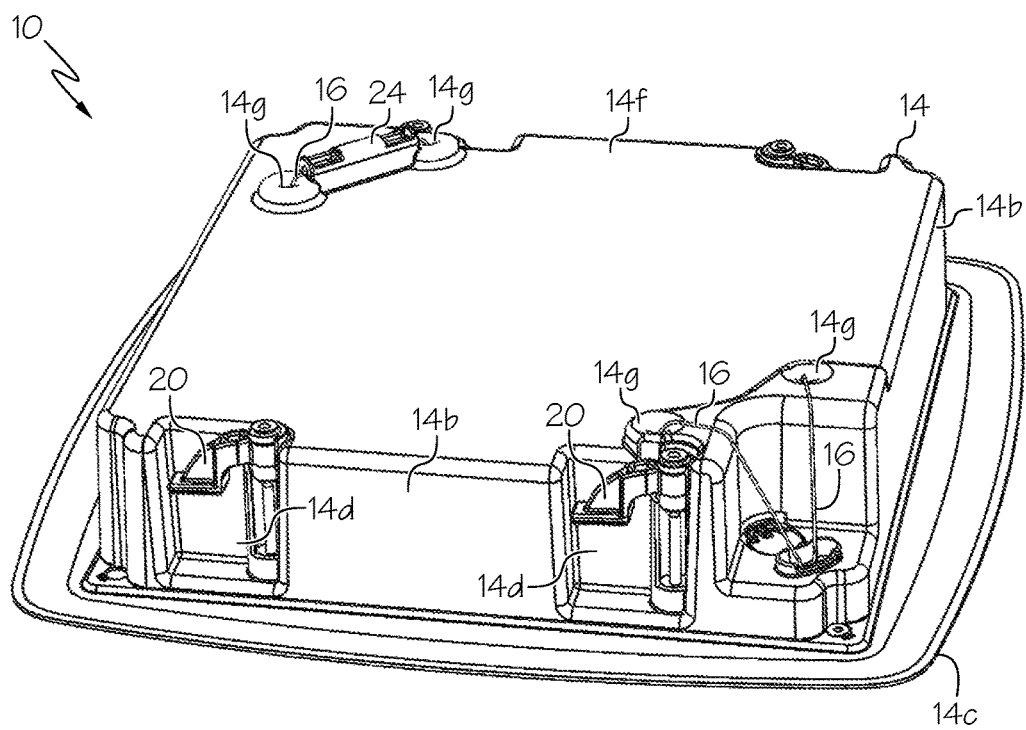
FIG. 10 is a top perspective view of the mount of FIG. 1 having swing clamps.
Figure 11:
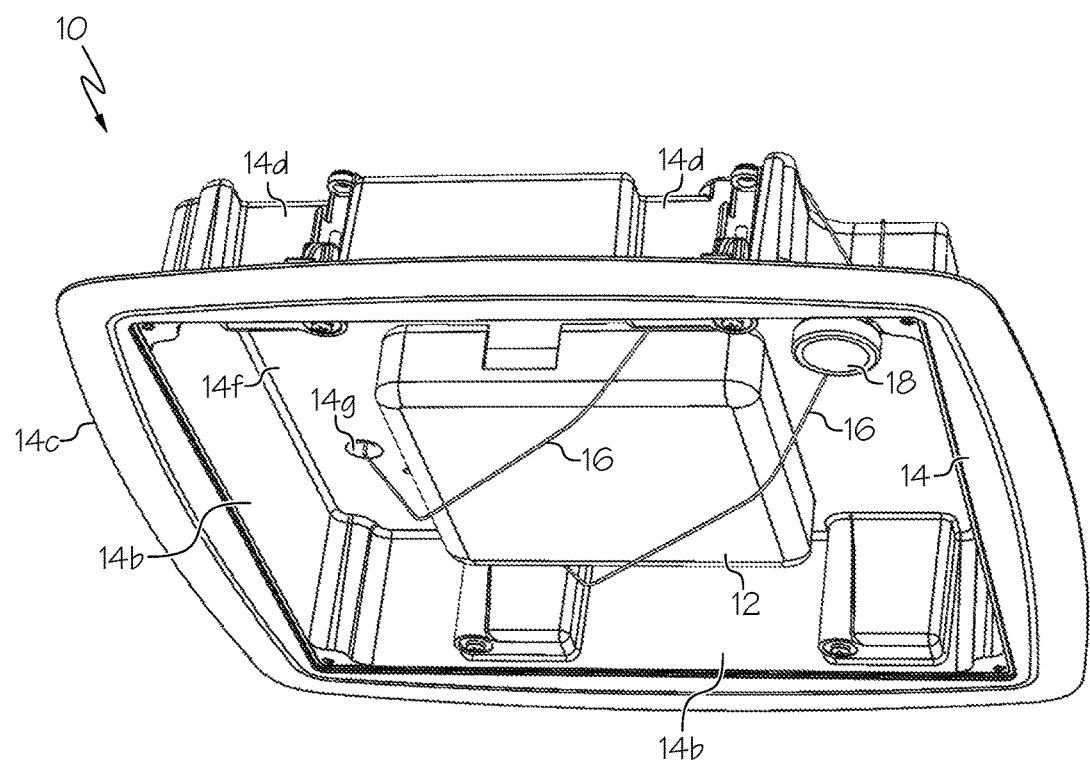
FIG. 11 is a bottom perspective view of the mount of FIG. 1, shown with a connected AP.
Figure 12:
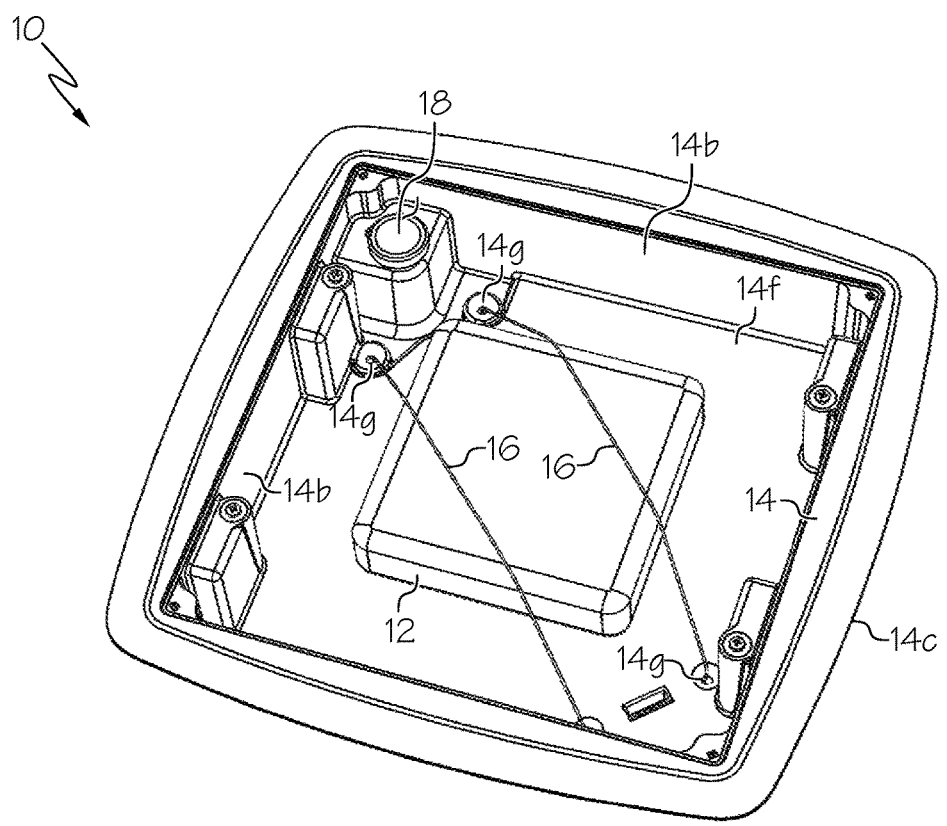
FIG. 12 is a different bottom perspective view of the mount of FIG. 1 shown with a connected AP.
Figure 13:
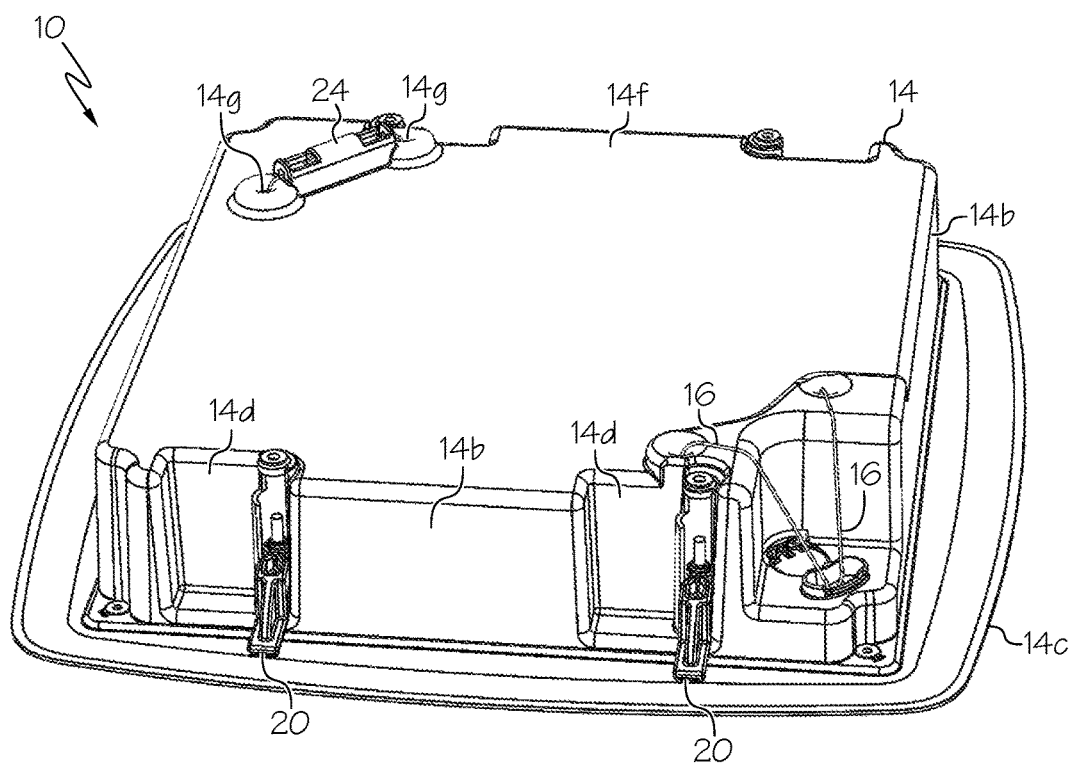
FIG. 13 is a closer view of the front perspective view of FIG. 2, which does not show the mount installed.
Figure 14:
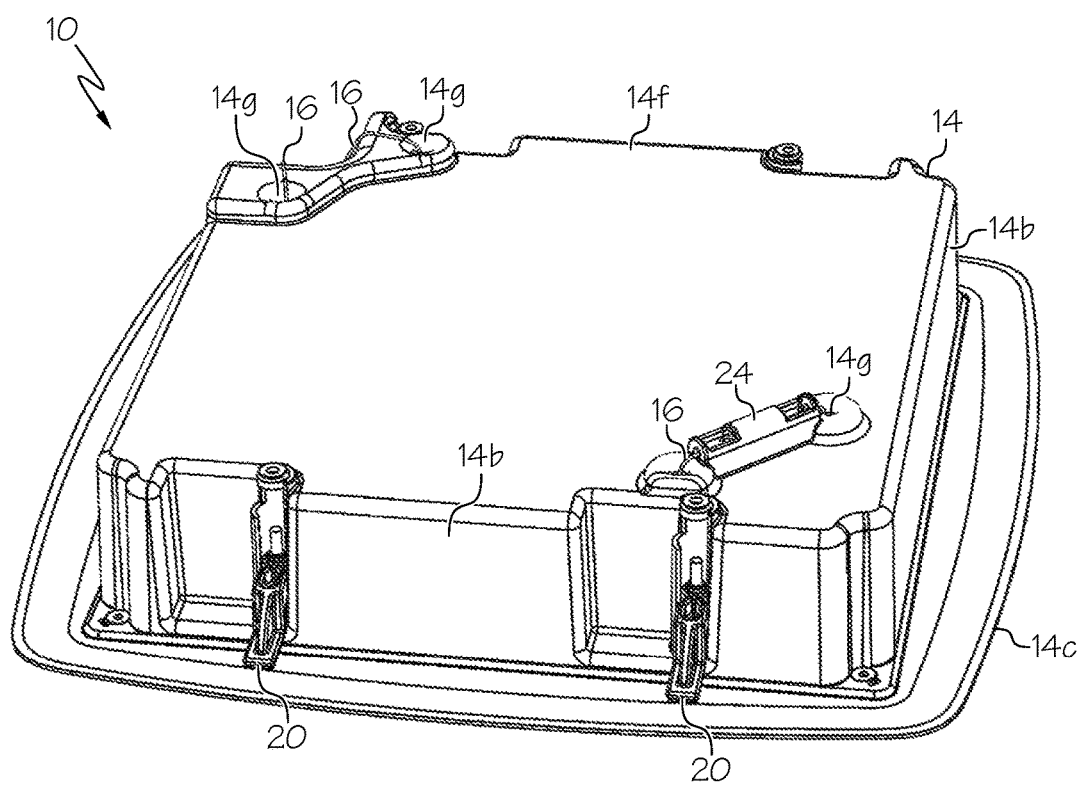
FIG. 14 is a closer view of the rear perspective view of FIG. 3, which does not show the mount installed.
Figure 15:
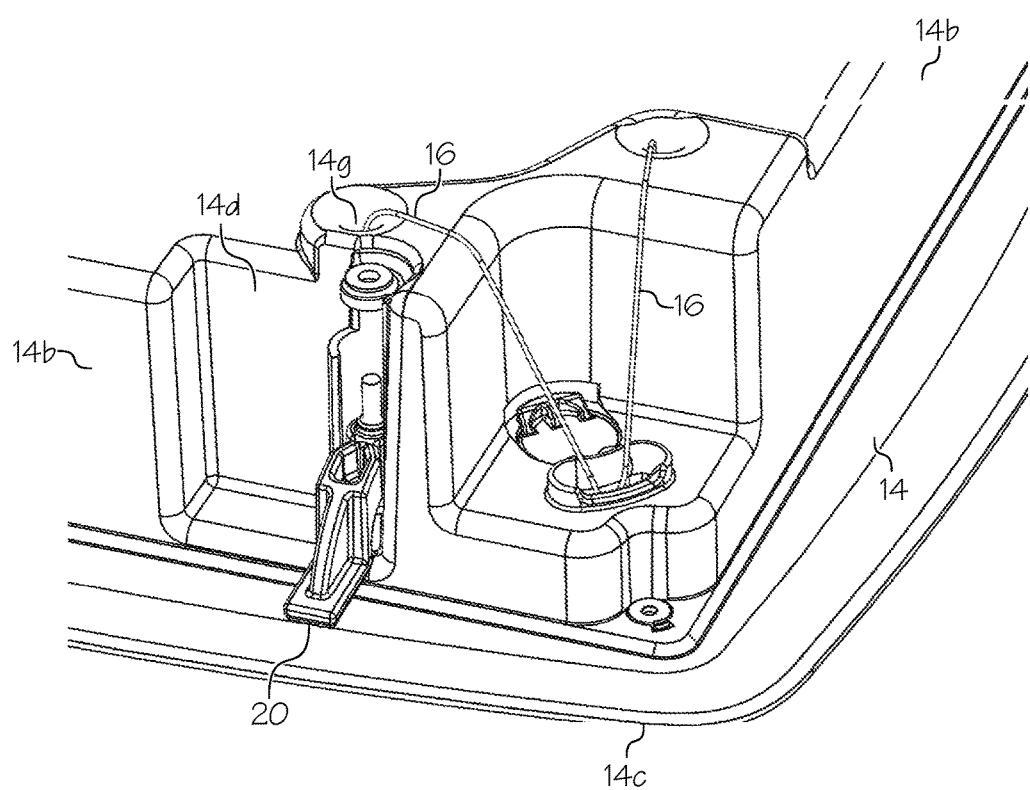
FIG. 15 is a close-up perspective view of a cable winding device of the mount of FIG. 1.
Figure 16:
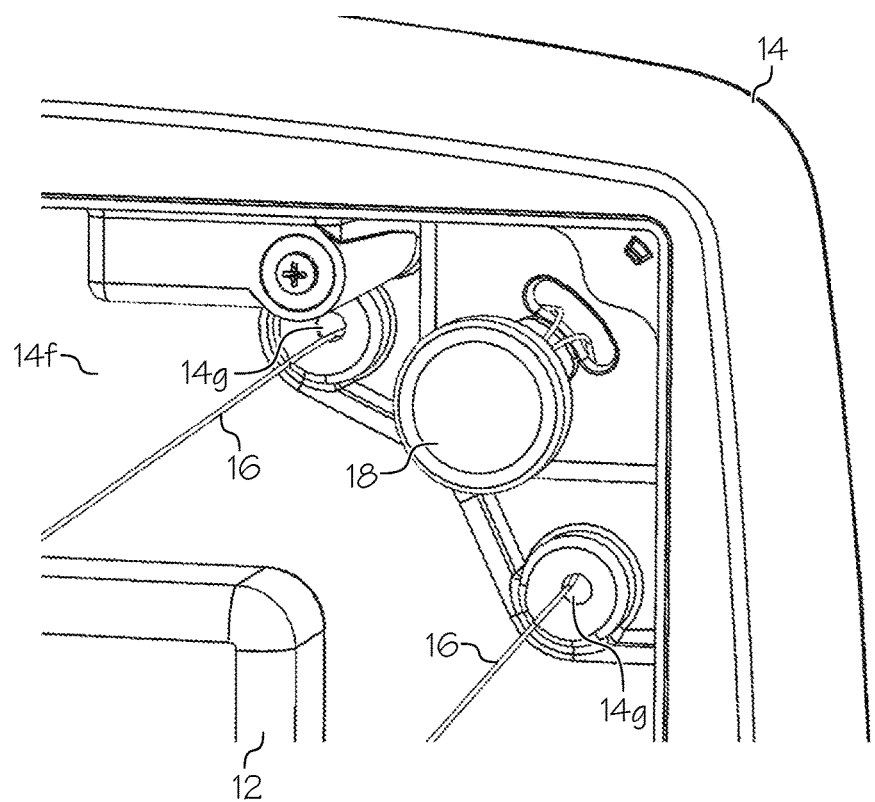
FIG. 16 is a close-up top plan view of the cable winding device of FIG. 15.
Figure 17:
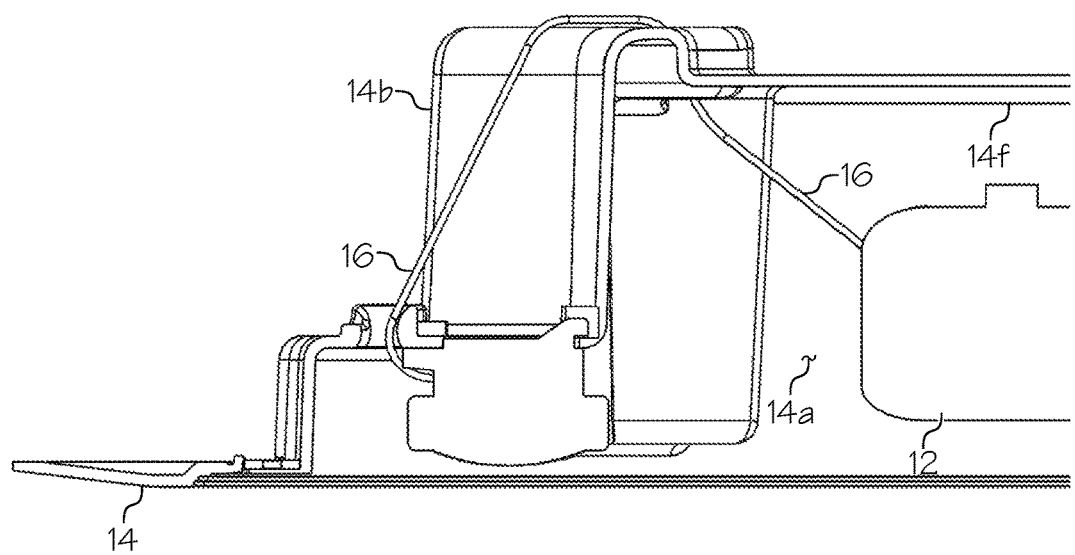
FIG. 17 is a close-up sectional view of the cable winding device of FIG. 15.
Figure 18:
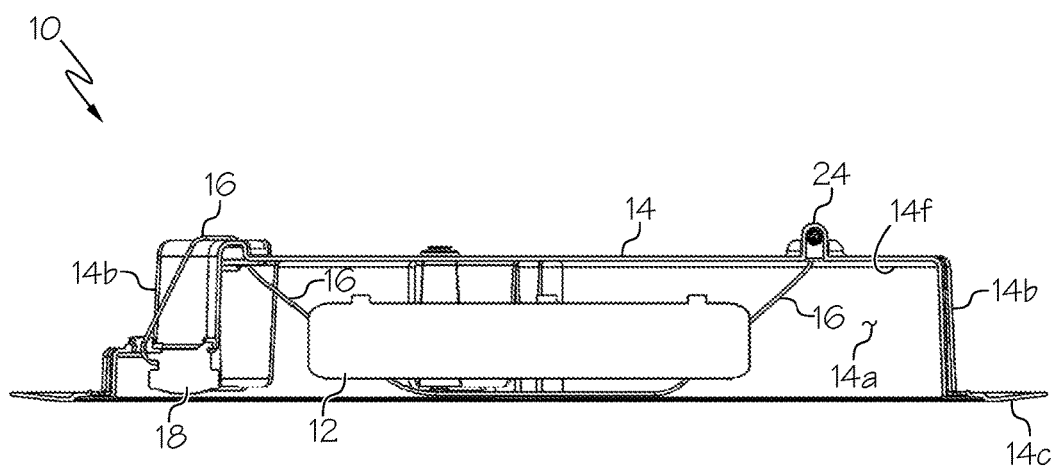
FIG. 18 is a front sectional view of the mount of FIG. 1.
Figure 19:
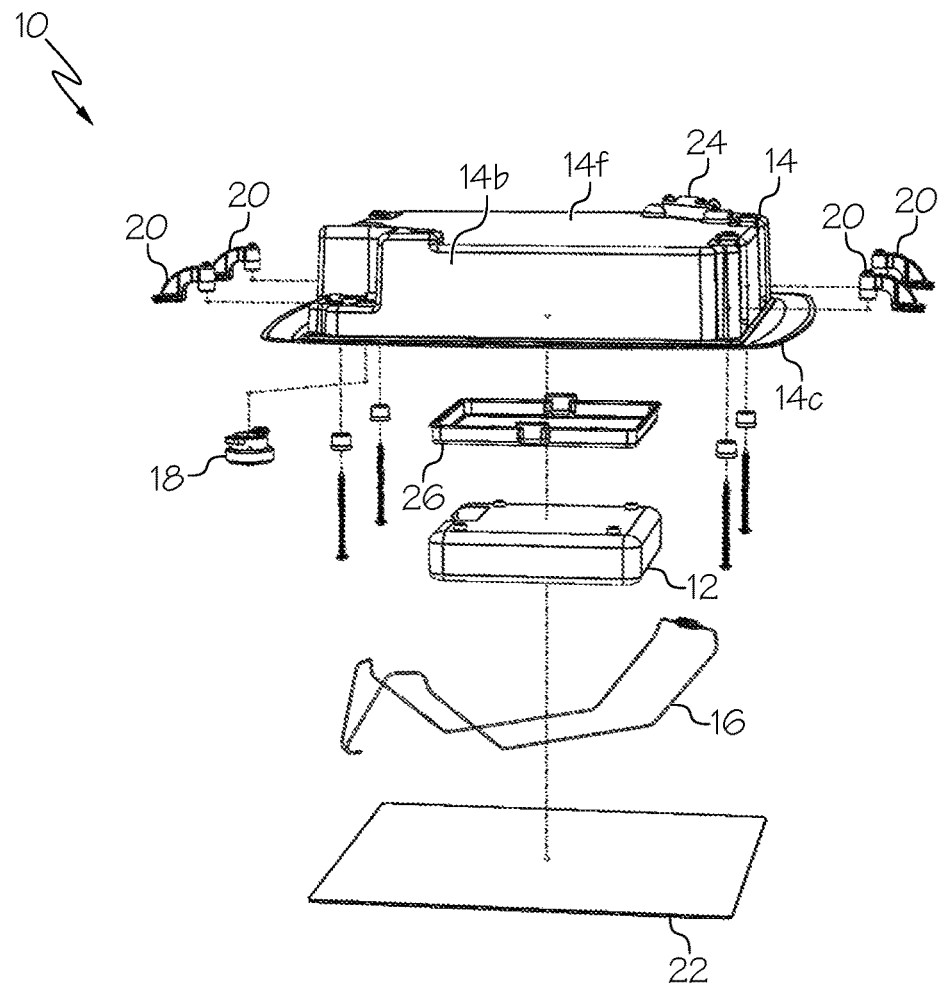
FIG. 19 is an exploded front perspective view of the mount of FIG. 1, shown with a spacer between the AP and a housing of the mount.
Figure 20:
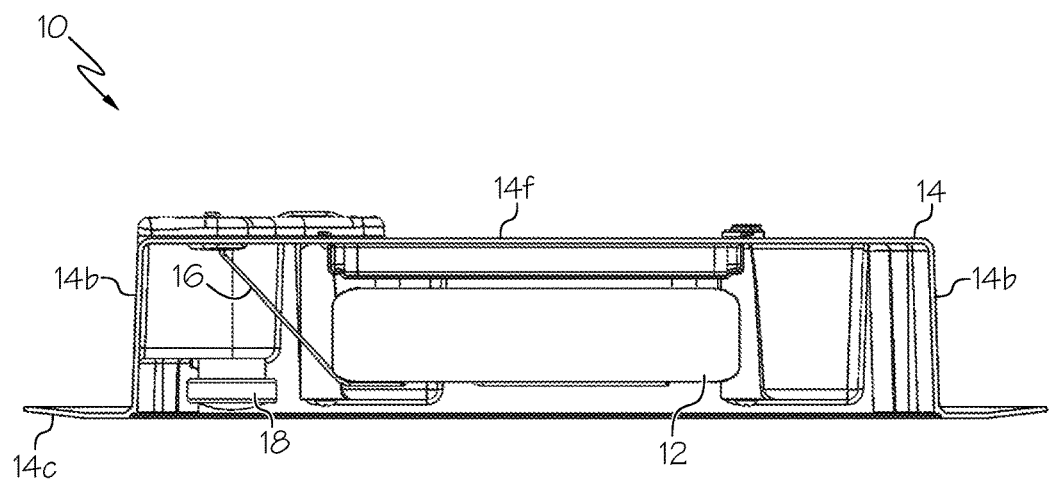
FIG. 20 is a rear sectional view of the mount of FIG. 19, shown with the spacer installed between the AP and the housing.
Figure 21:
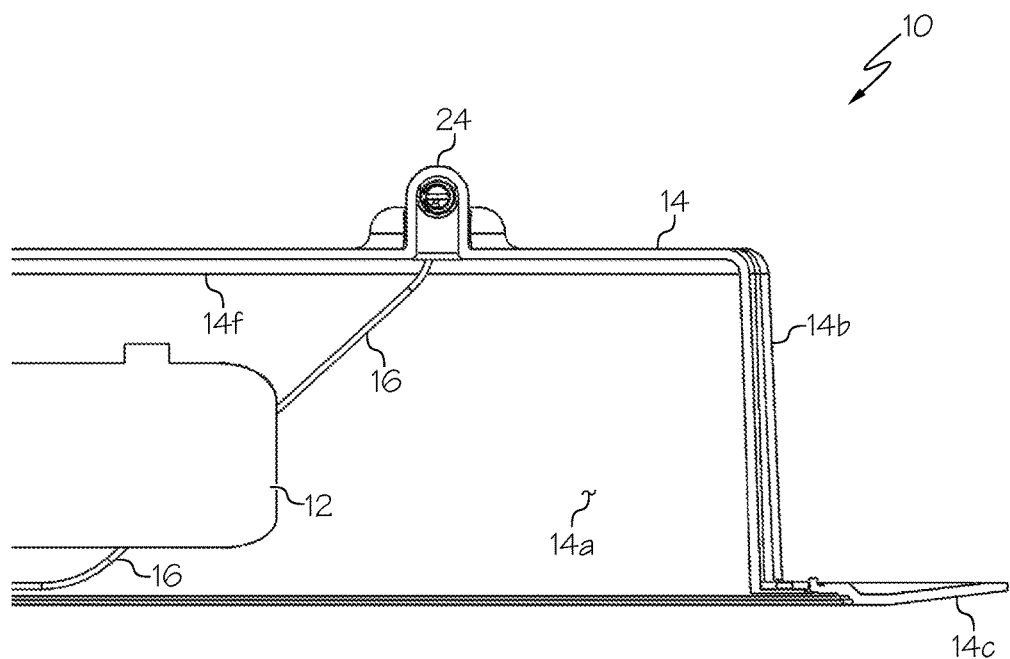
FIG. 21 is a close-up sectional view of a cable of the mount of FIG. 1 connected to a spring.

The present invention is best understood by reference to the detailed drawings and description set forth herein. Embodiments of the invention are discussed below with reference to the drawings; however, those skilled in the art will readily appreciate that the detailed description given herein with respect to these figures is for explanatory purposes as the invention extends beyond these limited embodiments. For example, in light of the teachings of the present invention, those skilled in the art will recognize a multiplicity of alternate and suitable approaches, depending upon the needs of the particular application, to implement the functionality of any given detail described herein beyond the particular implementation choices in the following embodiments described and shown. That is, numerous modifications and variations of the invention may exist that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

The present invention should not be limited to the particular methodology, compounds, materials, manufacturing techniques, uses, and applications, described herein, as these may vary. The terminology used herein is used for the purpose of describing particular embodiments only, and is not intended to limit the scope of the present invention. As used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" may be a reference to one or more steps or means and may include sub-steps and subservient means.

All conjunctions used herein are to be understood in the most inclusive sense possible. Thus, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should be read as "and/or" unless expressly stated otherwise. Structures described herein are to be understood also to refer to functional equivalents of such structures. Language that may be construed to express approximation should be so understood unless the context clearly dictates otherwise.

Unless otherwise defined, all terms (including technical and scientific terms) are to be given their ordinary and customary meaning to a person of ordinary skill in the art, and are not to be limited to a special or customized meaning unless expressly so defined herein.

Terms and phrases used in this application, and variations thereof, especially in the appended claims, unless otherwise expressly stated, should be construed as open ended as opposed to limiting. As examples of the foregoing, the term "including" should be read to mean "including, without limitation," "including but not limited to," or the like; the term "having" should be interpreted as "having at least"; the term "includes" should be interpreted as "includes but is not limited to"; the term "example" is used to provide exemplary instances of the item in discussion, not an exhaustive or limiting list thereof: and use of terms like "preferably," "preferred," "desired," "desirable," or "exemplary" and words of similar meaning should not be understood as implying that certain features are critical, essential, or even important to the structure or function of the invention, but instead as merely intended to highlight alternative or additional features that may or may not be utilized in a particular embodiment of the invention.

Those skilled in the art will also understand that if a specific number of an introduced claim recitation is intended, such an intent will be explicitly recited in the claim, and in the absence of such recitation no such intent is present. For example, as an aid to understanding, the appended claims may contain usage of the introductory phrases "at least one" and "one or more" to introduce claim recitations; however, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and "an" should typically be interpreted to mean "at least one" or "one or more"): the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C" is used, in general, such a construction is intended in the sense one having skill in the art would understand the convention (e.g., "a system having at least one of A. B, and C" would include but not be limited to systems that have A alone, B alone, C alone. A and B together, A and C together, B and C together, and/or A, B, and C together, etc.).

All numbers expressing dimensions, quantities of ingredients, reaction conditions, and so forth used in the specification are to be understood as being modified in all instances by the term "about" unless expressly stated otherwise. Accordingly, unless indicated to the contrary, the numerical parameters set forth herein are approximations that may vary depending upon the desired properties sought to be obtained.

As shown in FIGS. 1-22, the invention provides a mount 10 for an access point ("AP") 12 that can be installed on a ceiling 100 or a wall 100. Without limiting the invention, although the mount 10 can be installed on a ceiling or wall 100 of any type of structure (e.g., a house, an office, a yacht, or any building or structure having a ceiling or a wall), for purposes of describing the invention, an embodiment installed on a ceiling will be described hereafter with the understanding that the mount 10 also can be installed on a wall 100 of any structure. The mount 10 is installable in the ceiling 100 so as to be flush or substantially flush with the exterior surface (i.e., the surface facing into the room) of the ceiling. In other embodiments, the mount 10 may protrude or slightly protrude from the ceiling's exterior surface.

The AP 12 can be any networking hardware device that sends and receives wireless signals from wireless devices to connect them to a wired network. The AP 12 can be constructed in any shape but is typically rectangular or circular in horizontal cross-sectional shape. The AP 12 can receive power over Ethernet, from a USB cable, from an electrical cord, or from connection to a separate or integrated battery.

The mount 10 includes a housing 14, a tension member 16 (e.g., a cable, band, or strap), a retention device 18, and attachment means 20 for securing the mount 10 to the ceiling. Optionally, the mount 10 may also include a cover 22 for concealing the AP 12 within the housing 14.

For purposes of convenience and without limiting the breadth of the disclosure contained herein, a cable will be referred to hereafter as the tension member 16, with the understanding that the tension member 16 may be one or more cables, bands, straps, or other suitable tension members in various embodiments of the mount 10. Similarly, because the cable 16 will be referred to hereafter as an exemplary tension member, for purposes of convenience and without limiting the breadth of the disclosure contained herein, a cable retention device 18 will be referred to hereafter as an exemplary retention device 18 with the understanding that the retention device 18 may be one or more other suitable types of retention devices capable of adjusting tension on other types of tension members (e.g., cables, bands, straps, or a combination of the foregoing) in various embodiments of the mount 10. It is to be understood that where the cable 16 and cable retention device 18 are referred to hereafter, other tension members as described above and other retention devices could be used in place thereof.

The mount's housing 14 is shaped and sized for receiving an AP 12 that is installed within a compartment 14a of the housing. In exemplary embodiments, the housing 14 may be generally rectangular in horizontal cross-section. In other embodiments, the housing 14 can be circular in horizontal cross-section. In shape, APs 12 from most manufacturers will generally be either rectangular or circular in horizontal cross-section. In usage, an AP 12 can be installed within a mount 10 having a similar or identical cross-sectional shape. e.g., a rectangular AP can be installed within a mount having a housing that is also rectangular in cross-section. In another example, a circular AP 12 can be installed within a mount 10 having a housing that is also circular in cross-section. In other embodiments, an AP 12 that is circular in cross-sectional shape may be installed within a mount 10 having a housing that is rectangular in cross-sectional shape, or vice versa.

To attach the mount 10 to the ceiling 100, the housing 14 includes one or more (e.g., 1, 2, 3, 4, 5, 6, 7, 8, or more) attachment means 20 that can be clamps, clips, hooks, screws, nails, nuts and bolts, or other suitable attachment means 20 or combinations of two or more of the foregoing that are used to secure the housing 14 to the ceiling 100. In one exemplary embodiment shown in the drawings, the housing 14 may include four swing clamps 20 that may be used to connect the housing 14 to the ceiling 100. The attachment means 20 may be attached to side walls 14b of the housing 14 or to the lip 14c of the housing. In the embodiment shown in the drawings, swing clamps 20 are used as the attachment means 20 and the swing clamps are installed in recesses 14d formed in outer surfaces 14e of the side walls 14b of the housing 14.

In other embodiments, the mount 10 may be attached to the ceiling 100 via epoxy or other adhesive.

In an exemplary embodiment, the housing 10 can be constructed in the shape of a tray having an open compartment 14a. The tray can have a lip 14c that surrounds or partially surrounds an opening at a top of the housing's compartment 14a. A bottom of the housing 14 can include a bottom wall 14f surrounded by side walls 14b. For example, in an embodiment having a housing 14 that is rectangularly shaped in cross-section, the bottom wall 14f can be surrounded by four attached side walls 14b. In an embodiment having a housing 14 that is circularly shaped in cross-section, the bottom wall 14f can be surrounded by a single circular or annular side wall 14b. In other embodiments, depending on the shape of the bottom wall 14f or on design considerations, the bottom wall 14f may have 1, 2, 3, 4, 5, 6, 7, 8, or more attached side walls 14b. In other embodiments, the side walls 14b may be attached to the bottom wall 14f so as to form an oval, elliptical, oblong, triangular, quadrilateral, polygonal, or irregular shapes in cross-section. In such embodiments, the bottom wall 14f and the compartment 14a and opening may have a cross-sectional shape that matches that of the arrangement of the side walls 14b, or the bottom wall 14f may be larger than and extend beyond the boundary formed by the side walls 14b.

The housing 14 can be constructed in any size that is necessary to receive the AP 12 that is selected for installation within the compartment 14a of the housing. The housing 14 can be constructed from metal, plastic, wood, foam, or any other suitable material.

The housing 14 can include one or more utility apertures passing through one or more of its side walls 14b or through the bottom wall 14f to permit an Ethernet cable, USB cable, telephone line, coaxial cable, or power cord to be inserted therethrough to be connected to the AP 12 so as to supply power and a communicative connection to a wired network.

The bottom wall 14f of the housing 14 can include apertures 14g through which the cable 16 can be inserted to retain the AP 12 in position within the compartment 14a of the housing 14. The housing 14 can include a securement apparatus 24 for securing the cable 16 to the housing 14. In an exemplary embodiment, the cable 16 is constructed from steel although cables constructed from other materials may also be used, and the securement apparatus 24 can be a spring (e.g., a steel spring). A first end of the cable 16 is attached to a spring 24 that is located adjacent to the top surface of the housing 14. The spring 24 can be a steel spring having a first end and a second end. The cable 16 can be looped through the apertures 14g of the housing 14 so that the first end of the cable 16 attaches to the first end of the spring 24 and the second end of the cable 16 attaches to the second end of the spring 24, or vice versa. The spring 24 can be installed within a separate casing attached or adjacent to the top surface of the bottom wall 14f to conceal and protect it, or the spring 24 may be exposed. The spring 24 maintains tension in the cable 16 to keep the cable appropriately taut, even as the cable itself may relax over time, so as to retain the AP 12 in a fixed position inside the compartment 14a of the housing 14. The spring 24 will also maintain tension if the AP 12 is moved to another position while the cables 16 are taut, such as when moving the AP from a position that is off-center to center.

A second end of the cable 16 is attached to a cable retention device 18. The cable retention device 18 can be a cable winding device 18 that includes a knob for winding and unwinding the cable 16 to create more or less tension as needed to hold the AP 12 in position between the cable 16 and the bottom wall 14f of the housing 12 (or to release and remove the AP by lessening the tension of the cable) as shown in the drawings. In other embodiments, the cable retention device 18 can be a ratcheting or holding mechanism to create more or less tension in the cable 16 to hold and release the AP 12 in and from the compartment 14a of the housing 14 in a controlled manner. In the described embodiment, both the winding and ratcheting can be performed with one hand so as to allow simultaneous handling of the AP by the user's other hand.

Figure 22:
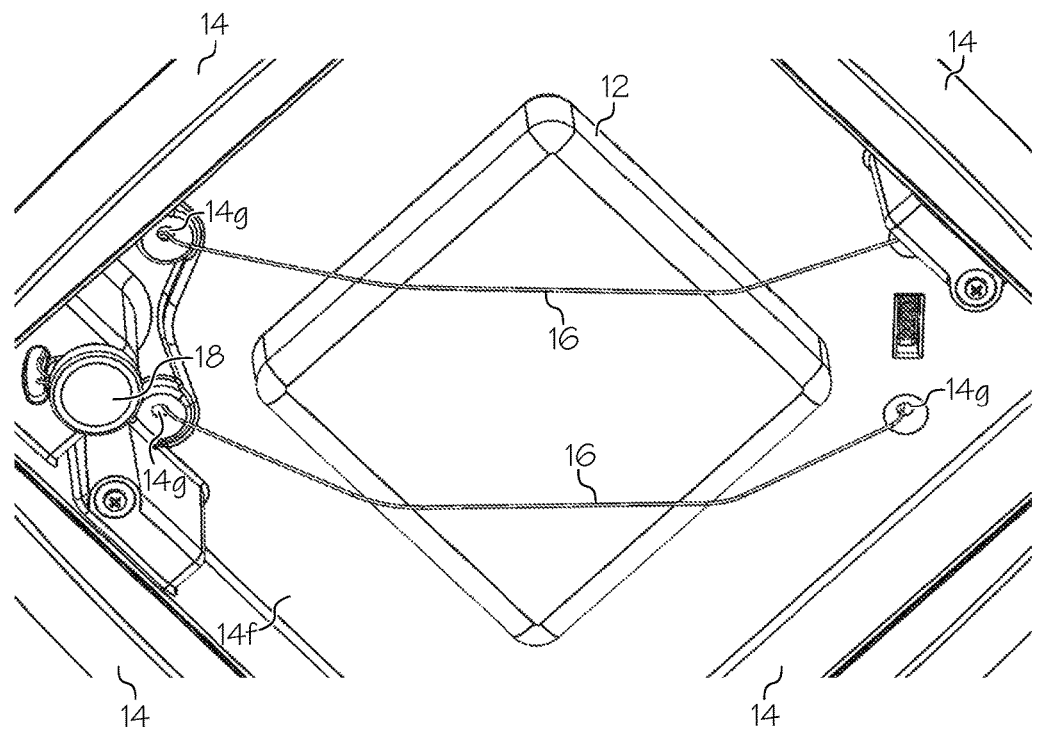
FIG. 22 is a closer bottom perspective view of the AP installed within the mount of FIG. 1.

A multiplicity of guides or apertures may be integrated into the housing or assembled as separate components in order to control the path of the retention member 16. In one embodiment, the housing 14 contains four apertures 14g: a first aperture, a second aperture, a third aperture, and a fourth aperture. In an exemplary embodiment shown in FIGS. 10-12, the bottom wall 14f of the housing 14 can include four apertures 14g: a first aperture, a second aperture, a third aperture, and a fourth aperture. In one embodiment, the first end of the cable 16 can be connected to the first end of the spring 24. The second end of the cable 16 can be inserted through a top surface of the housing 14 through the first aperture and into the compartment 14a where it runs generally horizontally across the bottom wall 14f in a first direction to the second aperture located on a side of the compartment that is opposite to the side of the compartment on which the first aperture is located. The second end of the cable 16 can pass through the second aperture and out of the compartment 14a to emerge from the second aperture at the top surface of the housing 14. There, the cable 16 can be looped around the cable winding device 18 in an exemplary embodiment (or otherwise engaged by a cable retention device in other embodiments) so that the cable 16 may be tightened or loosened as desired for installation and removal of the AP 12 or for adjustment of the position of the AP within the compartment 14a. The second end of the cable 16 then passes through the third aperture at the top surface back into the compartment 14a. The cable 16 then runs generally horizontally across the bottom wall 14f in a second direction to the fourth aperture located on a side of the compartment 14a that is opposite to the side of the compartment on which the third aperture is located. The second direction is opposite to the first direction. The length of the cable 16 running in the first direction from the first aperture to the second aperture forms a first length of cable that runs generally horizontally through the compartment 14a. The length of the cable 16 running in the second direction from the third aperture to the fourth aperture forms a second length of cable that runs generally horizontally through the compartment 14a and generally parallel to the first length of cable, as shown in FIG. 22. The second end of the cable 16 can be inserted through the fourth aperture where it exits the compartment 14a and emerges at the top surface of the housing 14 and connects to the second end of the spring 24.

In another embodiment, a first end of the cable 16 can be attached to a connection point that is fixed in position, for example, at the top surface of the housing or on or adjacent to an exterior or interior surface of a side wall of the housing, or on the bottom surface of the bottom wall of the housing inside the compartment. The connection point can be an anchor, a bar, a bolt, a rivet, or other connection apparatus to which the first end of the cable is tied or otherwise connected. In another embodiment, the two horizontal lengths of cable 16 can be combined into a single horizontal length of cable connected to the cable retention device and run through the apertures but not connected to a spring.

When the selected AP 12 is lower in profile (i.e., in height) than the depth of the compartment 14a of the housing 14, a spacer 26 may be placed between a bottom surface of the AP 12 and the bottom wall 14f inside the compartment 14a to raise the AP within the compartment so that a top surface of the AP is or is substantially coplanar with top edges of the side walls 14b of the housing 14. The spacer 26 may be constructed in any height that is necessary or desirable for raising the AP 12 away from the bottom wall 14f within the compartment 14a. The spacer 26 may be constructed from metal, plastic, foam, or any other suitable material.

The mount 10 can also include the aforementioned cover 22 for concealing the AP 12 within the compartment 14a of the housing 14. The cover 22 can be a screen or mesh similar in appearance to the screens and meshes used as components of in-ceiling-mounted and in-wall-mounted audio speakers so as to be aesthetically acceptable within a room of a home or other room or area. The cover 22 can be constructed and sized to fit within the compartment 14a so as to be flush with the lip 14c of the housing 14 when installed or to be slightly recessed into the compartment in relation to the lip of the housing when installed. In another embodiment, the cover 22 can be constructed and sized to partially overlap and cover a portion of the lip 14c of the housing 14 when installed. In still another embodiment, the cover 22 can be constructed and sized to entirely cover and conceal the housing 14, including its lip 14c, when installed.

Because the bottom of the housing 14 and compartment 14a face downward into the room, the cover 22 may use magnets, clips, or any other suitable attachment means to removably connect the cover to the housing. For example, in one embodiment, the housing 14 may include one or more magnets on or near its lip 14c for attracting and holding in place the cover 22 when the cover is constructed from a ferromagnetic material. In another embodiment in which the cover 22 is not constructed from a ferromagnetic material, the cover may include one or more ferromagnetic pieces on or near an interior surface of the cover for attracting and holding the cover in place. In still another embodiment, the housing 14 can be constructed from a ferromagnetic metal and the magnets may be included on or near an interior surface of the cover 22. In yet another embodiment in which the housing 14 is not constructed from a ferromagnetic metal, the magnets may be included on or near an interior surface of the cover 22 and the housing may include one or more ferromagnetic pieces (for example, near its corners where adjacent side walls 14b are adjoined or on its lip 14c) for attracting and holding the cover in place. In the exemplary embodiments described above, the mount 10 may include 1, 2, 3, 4, 5, 6, 7, 8, or more magnets or ferromagnetic pieces.

The mount 10 can be installed flush or substantially flush with the ceiling 100 in preferred embodiments. In other embodiments, the mount 10 may protrude or slightly protrude from the room-facing surface of the ceiling 100. A hole can be cut into the ceiling 100 (e.g., through the drywall) that approximately corresponds to the dimensions of the outer surface of the walls 14b of the housing 14. Installation in the center of the ceiling 100 is generally preferred although the mount 10 may be installed anywhere on the ceiling of the room or other area. The connection means 20 (e.g., swing clamps) can be used to connect the housing 14 to the edges of the ceiling 100 surrounding the hole. The lip 14c of the housing 14 can rest flush or substantially flush against the room-facing (i.e., exterior) surface of the ceiling 100. The compartment 14a of the housing 14, which faces downward into the room after installation of the housing, remains accessible for installation, service, and removal of the AP 12, which can be secured within the compartment 14a using the cable 16 and cable retention device 18 according to methods described herein above. When the AP 12 is securely installed within the compartment 14a in a desired position, the cover 22 can be placed over the compartment of the housing 14 to conceal the compartment and the AP within it. In one embodiment, the cover 22 may be large enough to also cover and conceal the lip 14c of the housing 14 so that no part of the mount 10 or AP 12 except the cover is visible to persons looking at the mount.

In exemplary embodiments, one side (e.g., a bottom side) of the AP 12 contacts and rests against the bottom wall 14f of the housing 14 when the AP is installed within the compartment 14a using the cable 16 and cable retention device 18. However, in other embodiments in which a low profile AP 12 is installed that is shorter in height than the depth of the compartment 14a, a spacer 26 may be placed between the AP and the bottom wall 14f inside the compartment so that one side of the spacer contacts the bottom wall while the other side of the spacer contacts the bottom side of the AP once the AP is secured within the compartment using the cable 16 and cable retention device 18. In still other embodiments, the AP 12 may be suspended by the cable 16, the first and second horizontal lengths of cable allowing the AP to be suspended inside the compartment 14a rather than being secured against and in contact with the bottom wall 14f of the housing 14. This latter embodiment is not preferred, however, since it would produce a less secure installation of the AP within the compartment.

If the mount 10 is to be installed on or in a wall 100, installation high on the wall, rather than in the middle or lower portions of the wall, is preferred so as to ensure maximum unimpeded signal strength throughout as much of the room or other area as possible.

Other Embodiments

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A mount for attaching a wireless access point (AP) device to a surface, the mount comprising:
   a housing comprising a bottom wall and at least one side wall defining a compartment;
   a tension member for securing the AP device within the compartment of the housing, wherein the tension member comprises a cable;
   a retention device for securing the tension member to or about the housing with adjustable tension, wherein the retention device comprises a cable retention device; and
   attachment means for securing the mount to the ceiling;
   wherein the bottom wall of the housing comprises at least one aperture through which the cable is insertable to retain the AP device in position within the compartment of the housing.

2. The mount of claim 1, wherein the tension member comprises one or more cables, bands, straps, other suitable tension members, or combinations of two or more of the foregoing.

3. The mount of claim 1, further comprising a securement apparatus for securing the tension member to the housing.

4. The mount of claim 3, wherein the securement apparatus comprises a spring to maintain tension on the tension member; wherein the spring comprises a first end and a second end and is located adjacent to the top surface of the housing; and wherein a first end of the cable is attached to the first end of the spring and a second end of the cable is attached to the second end of the spring.

5. The mount of claim 4, wherein the bottom wall of the housing comprises a first aperture, a second aperture, a third aperture, and a fourth aperture;
   wherein the second end of the cable is inserted through a top surface of the housing through the first aperture and into the compartment so that the second end of the cable runs generally horizontally across the bottom wall in a first direction to the second aperture located on a second side of the compartment that is opposite to a first side of the compartment on which the first aperture is located;
   wherein the second end of the cable passes through the second aperture and out of the compartment to emerge from the second aperture at the top surface of the housing;
   wherein the second end of the cable is engaged by the cable retention device at the top surface of the housing so that the cable may be tightened or loosened as desired for installation, positional adjustment, and removal of the AP device within the compartment;
   wherein the second end of the cable passes through the third aperture at the top surface back into the compartment so that the cable runs generally horizontally across the bottom wall in a second direction to the fourth aperture located on a fourth side of the compartment that is opposite to a third side of the compartment on which the third aperture is located; and wherein the second end of the cable is insertable through the fourth aperture where it exits the compartment and emerges at the top surface of the housing to connect to the second end of the spring.

6. The mount of claim 1, wherein the cable retention device comprises a cable winding device that comprises a knob for winding and unwinding the cable to create more or less tension for adjustably positioning the AP device between the cable and the bottom wall of the housing and for releasing and removing the AP device from the compartment of the housing by lessening the tension of the cable.

7. The mount of claim 1, further comprising a cover for attaching over an opening of the housing and for concealing the AP device within the housing.

8. The mount of claim 1, wherein the housing comprises one or more magnets on or near a lip of the housing for holding in place the cover when the cover is constructed from a ferromagnetic material.

9. The mount of claim 1, wherein the cover is not constructed from a ferromagnetic material, and the cover comprises one or more ferromagnetic pieces on or near an interior surface of the cover for holding the cover in place.

10. The mount of claim 1, wherein the housing is constructed from a ferromagnetic metal and further comprises one or more magnets on or near an interior surface of the cover for holding the cover in place.

11. The mount of claim 1, wherein the housing is not constructed from a ferromagnetic metal, and the housing comprises one or more magnets on or near an interior surface of the cover and one or more ferromagnetic pieces for holding the cover in place.

12. The mount of claim 1, further comprising a spacer placed between a bottom surface of the AP device and the bottom wall inside the compartment to raise the AP device within the compartment.

13. The mount of claim 1, wherein the attachment means comprises one or more clamps, swing clamps, clips, hooks, screws, nails, nuts and bolts, other suitable attachment means, or combinations of two or more of the foregoing.

14. The mount of claim 1, wherein the surface comprises a ceiling or a wall.

15. The mount of claim 1, wherein the housing comprises a lip that is flush or substantially flush against the surface when the mount is installed.

16. A method for securing a wireless access point (AP) device to a surface, the method comprising the steps of:
   (a) cutting an aperture into a surface on which an AP device is to be installed;
   (b) installing a mount over the aperture on the surface using attachment means for securing the mount to the surface, the mount comprising:
      a housing comprising a bottom wall and at least one side wall defining a compartment;
      a tension member for securing the AP device within the compartment of the housing, wherein the tension member comprises a cable;
      a retention device for securing the tension member to or about the housing with adjustable tension, wherein the retention device comprises a cable retention device; and
      the attachment means for securing the mount to the surface;
      wherein the bottom wall of the housing comprises at least one aperture through which the cable is insertable to retain the AP device in position within the compartment of the housing;
   (c) securing the AP device within the compartment using the tension member and the retention device.

17. The method of claim 16, further comprising the step of:
   (d) placing a cover over the compartment of the housing to conceal the compartment and the AP device secured within the compartment.

18. The method of claim 16, wherein the surface comprises a ceiling or a wall.

* * * * *